(12) United States Patent
Danielson

(10) Patent No.: US 11,178,789 B2
(45) Date of Patent: Nov. 16, 2021

(54) COMBINATION AIR-WATER COOLING DEVICE

(71) Applicant: Advanced Energy Industries, Inc., Fort Collins, CO (US)

(72) Inventor: Jon Danielson, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/835,685

(22) Filed: Mar. 31, 2020

(65) Prior Publication Data

US 2021/0307196 A1 Sep. 30, 2021

(51) Int. Cl.
*H05K 7/20* (2006.01)

(52) U.S. Cl.
CPC ..... *H05K 7/20254* (2013.01); *H05K 7/20336* (2013.01)

(58) Field of Classification Search
CPC ... H01L 23/473; H01L 23/427; H01L 23/467; H01L 23/3672; H01L 35/30; H05K 7/20254; H05K 7/20336; H05K 7/20409; H05K 7/20436
See application file for complete search history.

(56) References Cited

U.S. PATENT DOCUMENTS

| | | | | |
|---|---|---|---|---|
| 3,741,292 A | * | 6/1973 | Aakalu | H01L 23/427 165/104.21 |
| 4,923,003 A | * | 5/1990 | Stenlund | F28F 1/42 165/165 |
| 5,411,077 A | * | 5/1995 | Tousignant | F28D 15/02 165/104.33 |
| 6,591,898 B1 | | 7/2003 | Chu et al. | |
| 6,970,355 B2 | | 11/2005 | Ellsworth, Jr. et al. | |
| 6,988,534 B2 | | 1/2006 | Kenny et al. | |
| 6,994,151 B2 | | 2/2006 | Zhou et al. | |
| 7,000,684 B2 | | 2/2006 | Kenny et al. | |
| 7,201,012 B2 | | 4/2007 | Munch et al. | |
| 7,298,619 B1 | | 11/2007 | Malone et al. | |
| 7,539,020 B2 | | 5/2009 | Chow et al. | |
| 8,014,150 B2 | | 9/2011 | Campbell et al. | |
| 8,490,679 B2 | | 7/2013 | Campbell et al. | |
| 8,619,425 B2 | * | 12/2013 | Campbell | H05K 7/203 361/699 |

(Continued)

OTHER PUBLICATIONS

Harry Kim, "International Search Report and Written Opinion Regarding International Application No. PCT/US2021/023805", dated Jun. 8, 2021, p. 8, Published in: US.

*Primary Examiner* — Adam B Dravininkas
(74) *Attorney, Agent, or Firm* — Neugeboren O'Dowd PC

(57) ABSTRACT

Heat transfer systems and methods are disclosed. A heat transfer system includes an electronic enclosure that houses electronic components and includes a volume for a first fluid. A cold plate within the electronic enclosure is configured to contain a second fluid, and the cold plate includes a recess providing access to the second fluid. The heat transfer system also includes a heat transfer device configured to transfer heat from the first fluid to the second fluid. The heat transfer device is a single integrated piece that is situated within the recess wherein a first surface of the heat transfer device is configured to directly interface with the first fluid and a second surface of the heat transfer device is configured to directly interface with the second fluid.

22 Claims, 8 Drawing Sheets

(56) References Cited

U.S. PATENT DOCUMENTS

| | | | |
|---|---|---|---|
| 9,894,803 B1* | 2/2018 | Artis | H05K 7/20409 |
| 10,638,639 B1* | 4/2020 | Garner | F28D 15/0266 |
| 2004/0188064 A1* | 9/2004 | Upadhya | F28D 15/0266 |
| | | | 165/80.3 |
| 2010/0328889 A1* | 12/2010 | Campbell | H05K 7/20809 |
| | | | 361/700 |
| 2012/0061058 A1* | 3/2012 | Eriksen | G06F 1/20 |
| | | | 165/104.31 |
| 2016/0242313 A1* | 8/2016 | Singh | H05K 3/0061 |
| 2016/0338222 A1* | 11/2016 | Reeves | H01L 21/4878 |
| 2019/0373768 A1* | 12/2019 | Papoulis | H05K 7/20872 |

\* cited by examiner

COMBINATION AIR-WATER COOLING DEVICE

BACKGROUND

Field

The present disclosed embodiments relate generally to heat transfer systems, and more specifically to heat transfer systems to cool electronic components.

Background

Many electronic devices, such as high-power transistors and processors, require cooling to maintain normal operation. Typically, this type of cooling is performed by flowing air over the electronic device to remove heat or attaching an electronic device to a plate or bar containing a passage for water which removes heat. For many products, both cooling methods are required, which means water must be flown through a plate or bar, and air must be flown through the product.

To provide cool air and cool water, many products use an air/water heat exchanger to cool air that is continuously flown cyclically through the product. To cool air that is continuously run through a device, an air/water heat exchanger is needed. These types of exchangers can take many forms including: tube/fin heat exchanger, extruded heat sink, skived fin heat sink, zipper fin heat sink, etc.

Tube fin heat exchangers, while efficient, are typically expensive and multiple plumbing connections are required to connect water lines from the heat exchanger to other cooling devices such as a cold plate—decreasing reliability and adding cost.

Heat sinks, of all manufacturing methods, are less expensive and easier to install, but are not as efficient as heat exchangers because they typically require one or more thermal interface materials (e.g. thermal grease) and have more material between the air and water that heat must conduct through.

SUMMARY

An aspect may be characterized as a heat transfer system for electronic enclosures that includes a volume for a first fluid, a cold plate that is configured to contain a second fluid and includes a recess providing access to the second fluid, and a heat transfer device configured to transfer heat from the first fluid to the second fluid. The heat transfer device is a single integrated piece and is situated within the recess wherein a first surface of the heat transfer device is configured to directly interface with the first fluid and a second surface of the heat transfer device is configured to directly interface with the second fluid.

Another aspect may be characterized as a method for transferring heat within an electronic enclosure. The method includes providing an electronic enclosure housing electronic components and including a volume for a first fluid, providing a cold plate within the electronic enclosure configured to contain a second fluid, and transferring heat from the first fluid to the second fluid using a heat transfer device. The heat transfer device is a single integrated piece situated within a recess in the cold plate and includes a first surface configured to directly interface with the first fluid and a second surface configured to directly interface with the second fluid.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
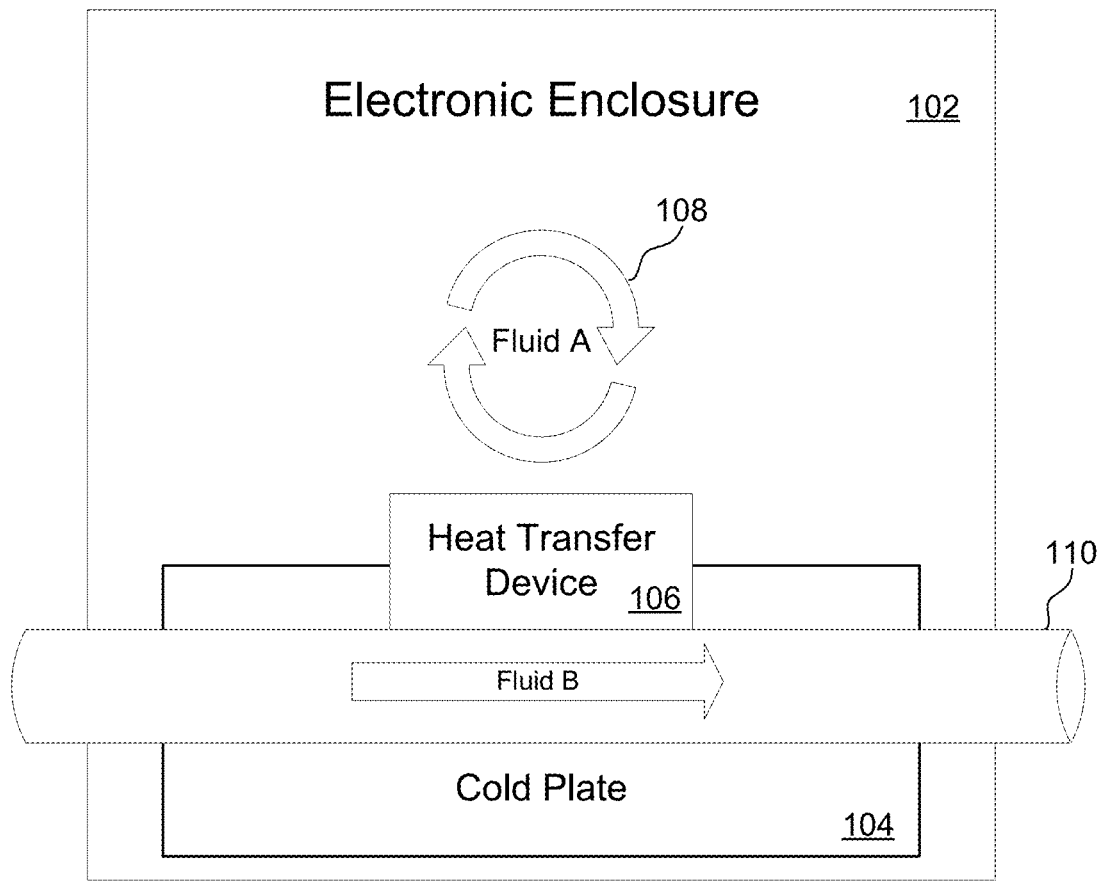
FIG. 1 illustrates an example of a heat transfer system of an electronic enclosure containing a heat transfer device configured to directly interface with two fluids.

FIG. 1 illustrates an exemplary embodiment of a heat transfer system of an electronic enclosure 102 containing a heat transfer device 106 configured to directly interface with two fluids. In such a heat transfer system, the electronic enclosure 102 may contain a cold plate 104 that is configured to couple with a heat transfer device 106. The electronic enclosure 102 may also house one or more potentially heat-generating electronic components, which may, for example, thermally interface with the cold plate 104. The electronic enclosure 102 may further contain a volume for a first fluid, here Fluid A 108, while the cold plate 104 may be configured to contain a second fluid, here Fluid B 110. The heat transfer device 106 may be configured to be a single integrated piece that directly interfaces with Fluid A 108 on a first surface and directly interfaces with Fluid B 110 on a second surface so that Fluid A 108 and Fluid B 110 are physically separated from each other.

In some embodiments, Fluid A 108 may circulate within the electronic enclosure 102 and may flow over the first surface of the heat transfer device 106. Similarly, Fluid B 110 may flow through the cold plate 104 and flow over the second surface of the heat transfer device 106. Furthermore, the heat transfer device 106 may be configured to have one or more protrusions extending from one or more of its surfaces, which may be shaped to improve overall heat transfer efficiency. For example, the protrusions may be fin-shaped, stacked fin-shaped, cylindrical, or any of several geometries known in the art to improve the efficiency of heat transfer. Protrusion geometry may be optimized for a variety of operating conditions, such as differing fluids, flow rates, and thermal environments. The combination of flowing Fluid A 108 and Fluid B 110 over the surfaces of the heat transfer device 106 and including protrusions on these surfaces may significantly increase the overall heat transfer efficiency between the two fluids. Furthermore, the heat transfer device 106 may also include aluminum or copper alloys or other thermally conductive materials known in the art, which may further aid in enhancing heat transfer efficiency.

In some embodiments, the heat transfer device 106 may couple to the cold plate 104 to form a sealed cavity that is provides access to Fluid B 110 via the cold plate 104. The walls of the sealed cavity may be formed by a surface of the heat transfer device 106 and a surface of the cold plate 104. Such a sealed cavity may either be contained within the cold plate 104, be contained within the heat transfer device 106, or extend into both the cold plate 104 and the heat transfer device 106.

In some embodiments, the cold plate 104 may contain a recess providing access to Fluid B 110 into which the heat transfer device 106 may be inserted to form a sealed cavity, or channel, between the cold plate 104 and the heat transfer device 106 though which Fluid B 110 may flow. This seal between the cold plate 104 and the heat transfer device 106 could be formed, for example, by adhesive bonding, brazing, welding, friction stir welding, an O-ring or other elastomer seal, or a variety of other methods known in the art.

In some embodiments, heat may be transferred from Fluid A 108 to Fluid B 110 via the heat transfer device 106. Fluid A 108 and Fluid B 110 may each be any of a number of fluids, such as air, water, water glycol, antifreeze, or any other fluid known in the art to be used in heat transfer systems. For example, Fluid A 108 may be air circulated within an electronic enclosure 102, which may be closed from the outside environment, and Fluid B 110 may be water flowed through the cold plate 104. The air 108 may absorb heat within the electronic enclosure 102 and flow over a first surface of the heat transfer device 106 to transfer this heat. The heat transfer device 106 may then transfer this heat to the water 110 flowing through the cold plate 104 directly via a second surface, which may be on the opposite side of a plate to the first surface. Such an arrangement may allow both the air and water interfacing surfaces of the heat transfer device 106 to be combined into a single integrated piece, potentially reducing thermal resistance and production costs by eliminating excess material and excessive thermal interfaces. The water 110 may then flow out of the electronic enclosure 102 to remove the excess heat from the system.

Figure 2:
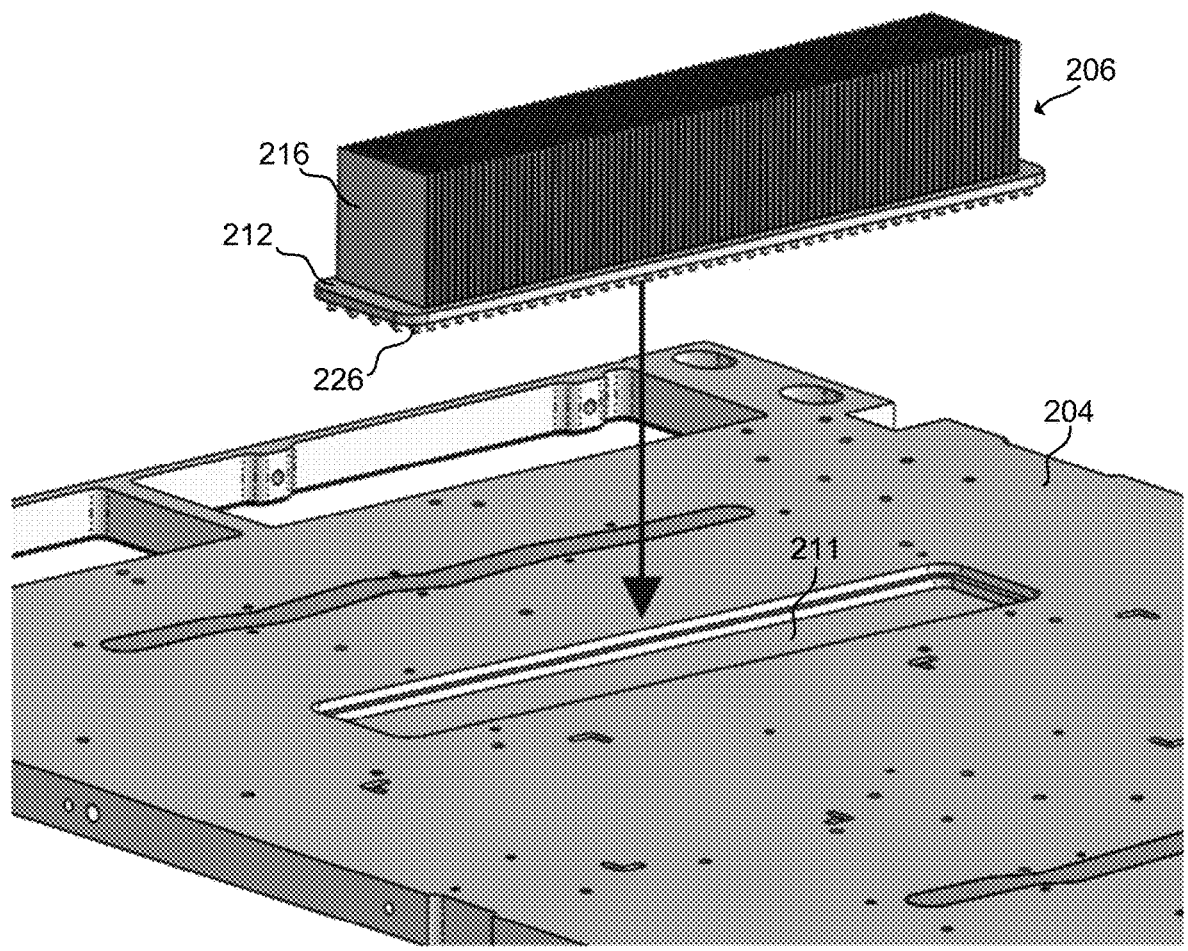
FIG. 2 illustrates an example of a heat transfer device with fins on the top and bottom surfaces.

FIG. 2 is an exploded view that illustrates an exemplary embodiment of a heat transfer device 206 with top surface protrusions 216 on a top surface of the heat transfer device 206 and bottom surface protrusions 226 on a bottom surface of the of the heat transfer device 206. The heat transfer device 206 may be configured to be inserted into a recess 211 within a cold plate 204 of an electronic enclosure to form a sealed cavity through which a fluid flowing through the cold plate 204 may pass. The recess 211 may have a raised lip running around its perimeter configured to interface with a central plate 212 of the heat transfer device 206. As shown in FIG. 2, the top surface protrusions 216 may be fin-shaped protrusions and the bottom surface protrusions 226 may be tapered-fin-shaped protrusions, but this is not required in many implementations and the top surface protrusions 216 and bottom surface protrusions 226 may be realized by different geometries. As used herein, the terms "top" and "bottom" are merely relative positions for reference only and should not be interpreted as being limited by a direction of a force of gravity.

The top surface protrusions 216 are shown extending into the electronic enclosure on a first side and the bottom surface protrusions 226 are shown extending into the recess 211 on a second side. The central plate 212 and top surface protrusions 216 of the heat transfer device 206 may directly interface with a first fluid contained within the electronic enclosure and exterior to the cold plate 204, and the central plate 212 and bottom surface protrusions 226 may directly interface with a second fluid contained within the cold plate 204. The combining of the interfacing surfaces of both fluids into a single integrated piece forming the heat transfer device 206 may potentially reduce thermal resistance and production costs by eliminating excess material and excessive thermal interfaces.

Figure 3:
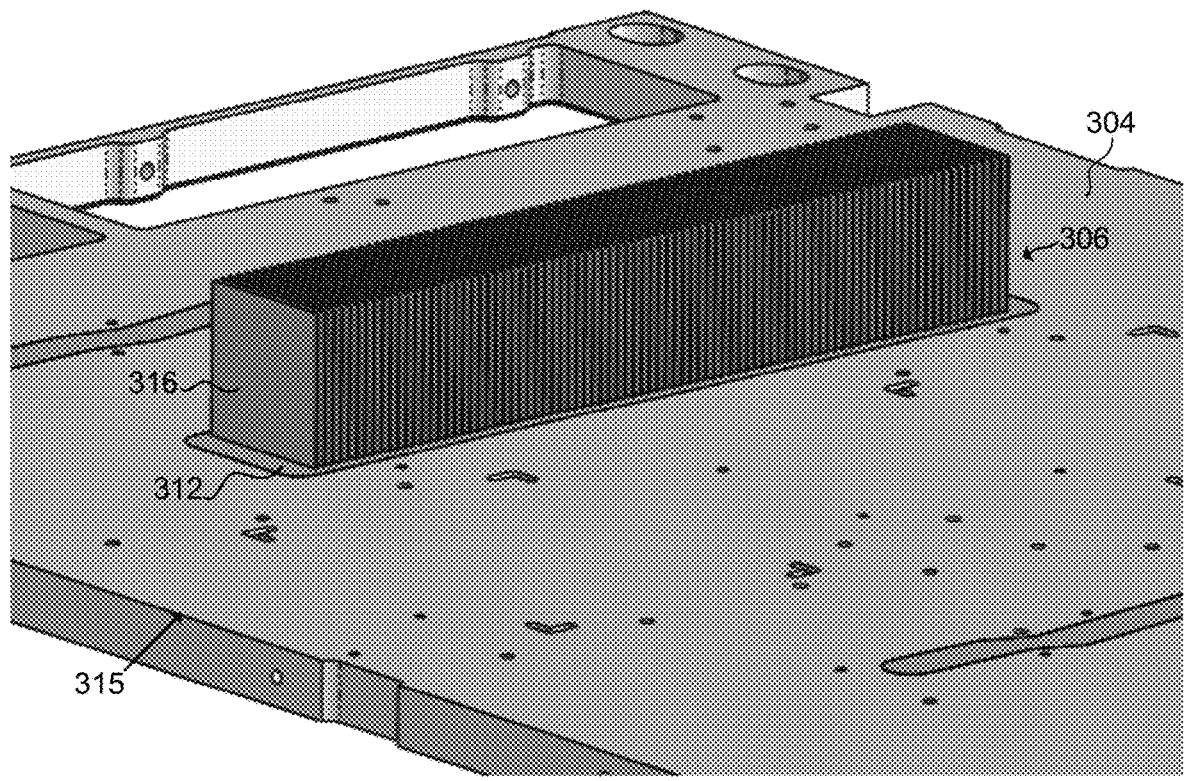
FIG. 3 illustrates an example of a heat transfer device that has been coupled to a cold plate.

FIG. 3 illustrates an exemplary embodiment of a heat transfer device 306, such as the heat transfer device of FIG. 2, that has been coupled to a cold plate 304. The heat transfer device 306 may be inserted into a recess of a cold plate 304, such as the cold plate of FIG. 2, and sealed in place using, for example, adhesive bonding, brazing, welding, friction stir welding, an O-ring or other elastomer seal, or a variety of other sealing methods known in the art. After coupling together, the top surface of a central plate 312 of the heat transfer device 306 may be flush with the top surface 315 of the cold plate 304, and the top surface protrusions 316 (e.g., fin-shaped protrusions) may extend from this top surface of the heat transfer device 306 into the electronic enclosure. In other embodiments, this top surface of the central plate 312 of the heat transfer device 306 may protrude from or recess into the top surface 315 of the cold plate 304.

Figure 4:
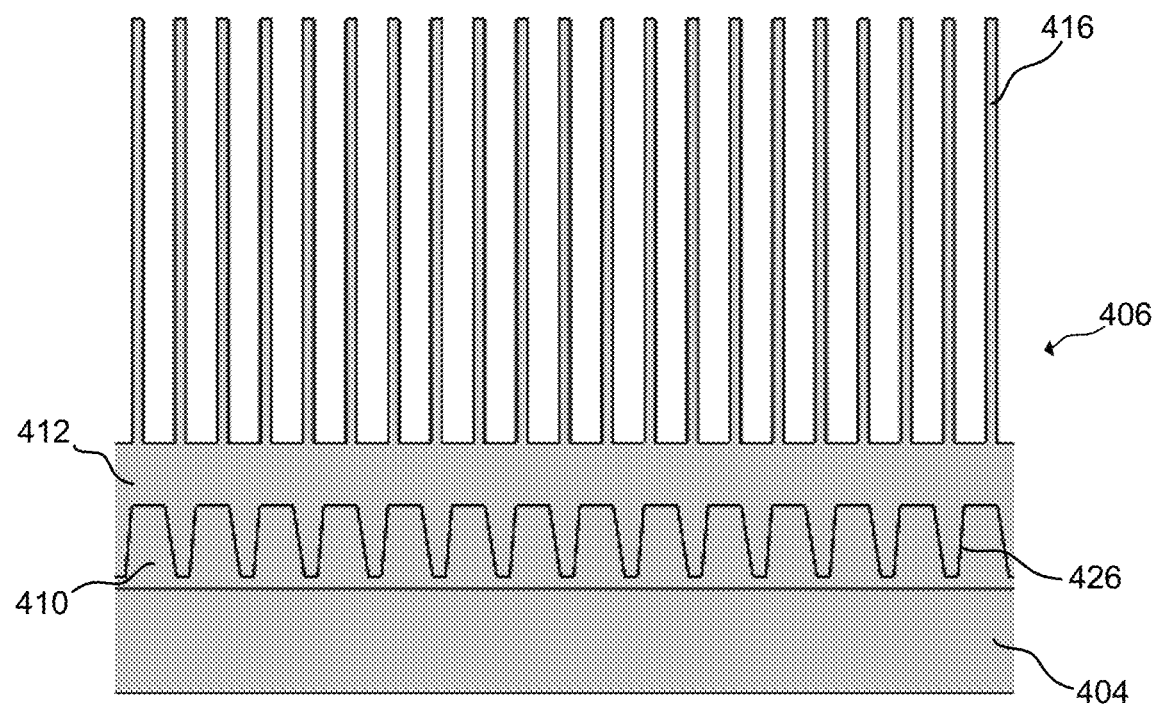
FIG. 4 illustrates an example of a cross-sectional view of a heat transfer device that has been coupled to a cold plate.

FIG. 4 illustrates a cross-sectional view of an exemplary embodiment of a heat transfer device 406 that has been coupled to a cold plate 404, such as the coupled heat transfer device and cold plate of FIG. 3. The coupling of the heat transfer device 406 and the cold plate 404 may form a cavity, or channel 410, between the bottom surface of the heat transfer device 406 and a surface of the cold plate 404. The cold plate 404 may provide the channel 410 access to a fluid within the cold plate 404, which may flow through the channel 410. In this embodiment, the top surface protrusions 416 are thin, fin-shaped protrusions that extend from the top surface of the central plate 412 of the heat transfer device 406 and into the fluid contained within the electronic enclosure, while the bottom surface protrusions 426 are realized by thicker, tapered-fin-shaped protrusions that extend from the bottom surface of the central plate 412 and into the fluid contained within the channel 410.

The geometry of these top surface protrusions 416 and bottom surface protrusions 426 is not limited to the geometries depicted in FIG. 4. For example, the geometries may change to be optimized to improve heat transfer efficiency depending on operating conditions, such as fluid type, fluid flow velocity, and thermal environment. For example, top surface protrusions 416 that are long thin fin shaped may provide an increased surface area for a gas, such as air, to transfer heat into the heat transfer device 406 without overly impeding its flow within the electronic enclosure; however, such a protrusion geometry may significantly impede the flow of other fluids. For example, the bottom surface protrusions 426 may be thicker and shorter with wider spacing, which may allow a more viscous, incompressible liquid, such as water, to flow more easily through the channel 410 without overly reducing the heat transfer efficiency gained from introducing such protrusions.

Figure 5:
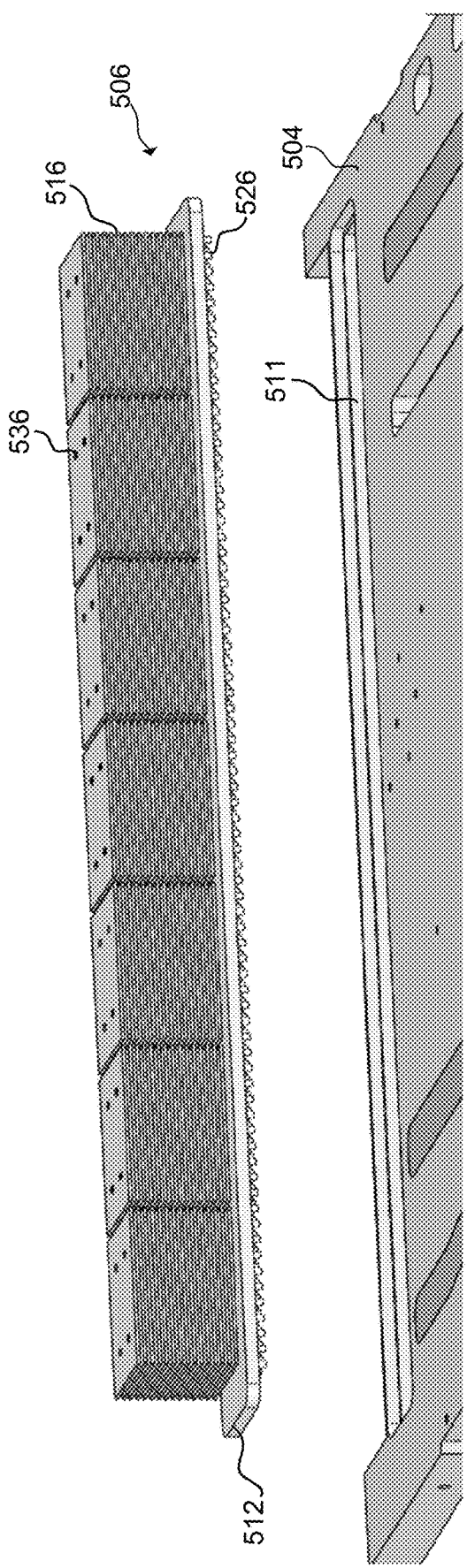
FIG. 5 illustrates an example of a heat transfer device with stacked fins on a top surface and cylindrical protrusions on a bottom surface.

FIG. 5 is an exploded view that illustrates an exemplary embodiment of a heat transfer device 506 where top surface protrusions 516 are realized by stacked fin-shaped protrusions on the top surface of a central plate 512 and bottom surface protrusions 526 are realized by cylindrical protrusions on the bottom surface of the central plate 512. The heat transfer device 506 may be configured to be inserted into a recess 511 within a cold plate 504 of an electronic enclosure to form a sealed cavity through which a fluid flowing through the cold plate 504 may pass. The recess 511 may have a raised lip running around its perimeter configured to interface with the central 512 plate of the heat transfer device 506. The top surface protrusions 516 (which are shown with an exemplary stacked fin-shape geometry) of the heat transfer device 506 may extend from the top surface of the central plate 512 and into the electronic enclosure, and the bottom surface protrusions 526 (which are shown with an exemplary cylindrical geometry) extend from the bottom surface of the central plate 512 and into the recess 511.

Additionally, the top surface protrusions 516 may contain heat pipes 536, which may further enhance heat conduction between the top surface protrusions 516 and the central plate 512. The central plate 512 of the heat transfer device 506 may directly interface with a first fluid contained within the electronic enclosure and exterior to the cold plate 504 and a second fluid contained within the cold plate 504. These exemplary stack fin-shape and cylindrical geometries (of the top surface protrusions 516 and bottom surface protrusions 526, respectively) may aid in the optimization of heat transfer efficiency between the first and second fluids in different ways. For example, the stacked fin-shape geometry may enable for a greater surface area for heat transfer and provide space for the introduction of conduction enhancers, such as the heat pipes 536, while cylindrical protrusion geometries may allow for less fluid flow inhibition.

Figure 6:
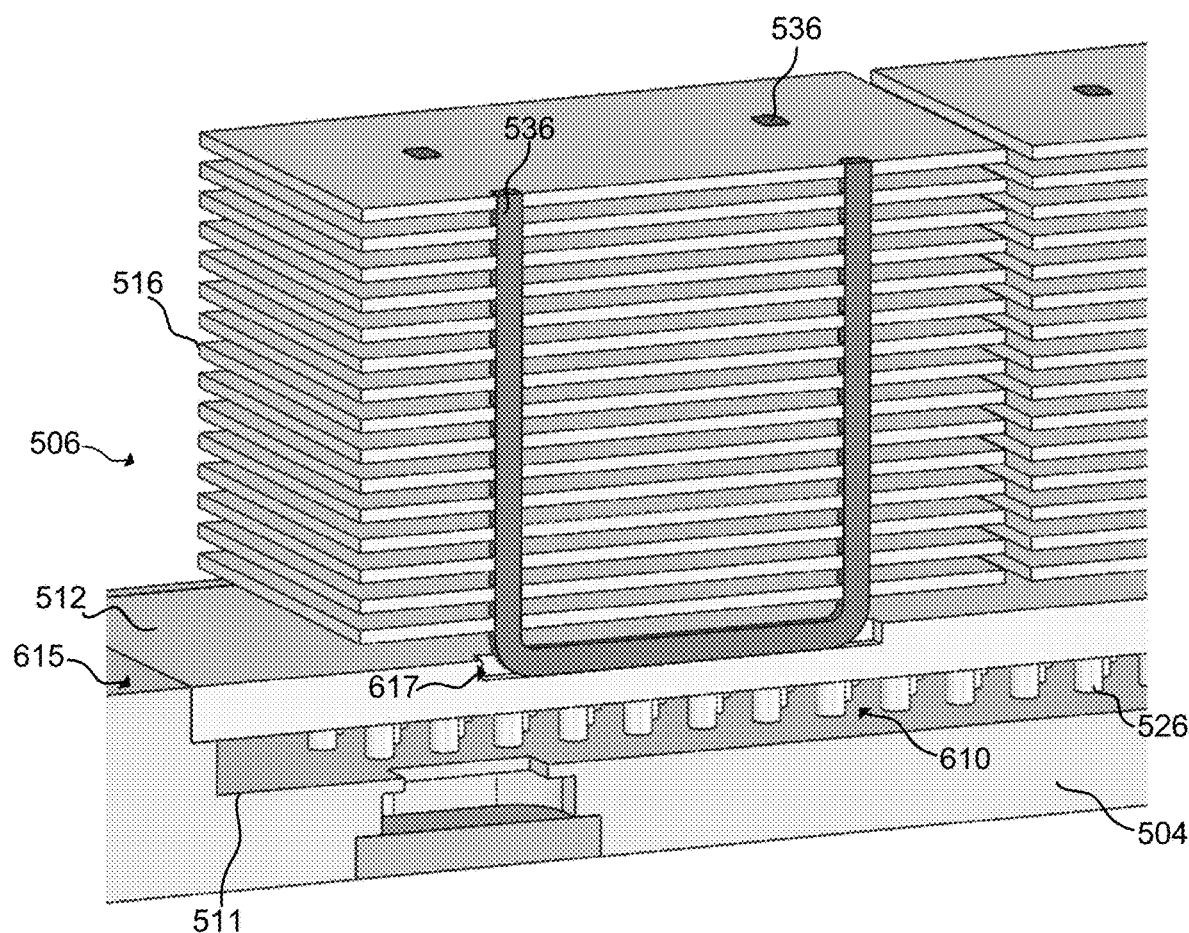
FIG. 6 is a partial cross-sectional view of the heat transfer device of FIG. 5.

FIG. 6 illustrates a partial cross-sectional view of the heat transfer device 506 described with reference to FIG. 5 showing the heat transfer device 506 coupled to the cold plate 504. The heat transfer device 506 may be inserted into the recess 511 of the cold plate 504, and sealed in place using, for example, adhesive bonding, brazing, welding, friction stir welding, an O-ring or other elastomer seal, or a variety of other sealing methods known in the art. After coupling together, a top surface of the central plate 512 of the heat transfer device 506 may be flush with a top surface 615 of the cold plate 504, and the top surface protrusions 516 may extend from this top surface of the central plate 512 of the heat transfer device 506 into the electronic enclosure. In other embodiments, this top surface of the central plate 512 of the heat transfer device 506 may protrude from or recess into a top surface 615 of the cold plate 504.

The coupling of the heat transfer device 506 and the cold plate 504 may form a cavity, or channel 610, between the bottom surface of the heat transfer device 506 and a surface of the cold plate 504. The cold plate 504 may provide the channel 610 access to a fluid within the cold plate 504, which may flow through the channel 610. As described with reference to FIG. 5, the top surface protrusions 516 may have a stacked fin-shape geometry and may extend from the top surface of the central plate 512 into the fluid contained within the electronic enclosure, while the bottom surface protrusions 526 may extend from the bottom surface of the central plate 512 and into the fluid contained within channel 610. The heat pipes 536 may be integrated into the top surface protrusions 516, passing through the stacked fins and into a recess 617 in the central plate 512 of the heat transfer device 506. These heat pipes 536 may enable an overall increase in heat transfer efficiency of the heat transfer device 506 by enhancing the conduction of heat between the top surface protrusions 516 and the central plate 512. In other embodiments, a variety of conduction enhancers known in the art may be introduced into surface protrusions in a similar manner.

Figure 7:
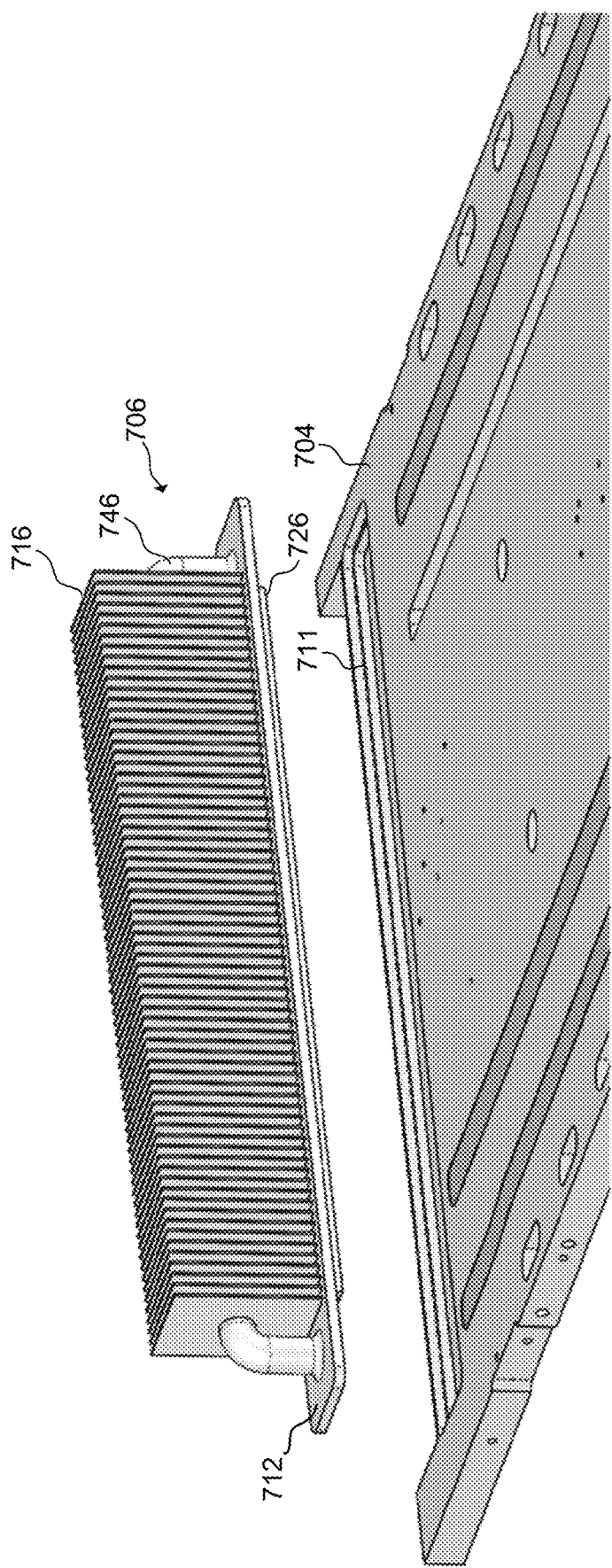
FIG. 7 illustrates an example of a heat transfer device with fins adjacent to the top surface through which a channel passes.

FIG. 7 illustrates an exemplary embodiment of a heat transfer device 706 with fin-shaped protrusions 716 adjacent to the top surface through which a channel 746 passes. The heat transfer device 706 may be configured to be inserted into a recess 711 within a cold plate 704 of an electronic enclosure to form a sealed cavity through which a fluid flowing through the cold plate 704 may pass. The recess 711 may have a raised lip running around its perimeter configured to interface with a central plate 712 of the heat transfer device 706. The heat transfer device 706 may have one or more protrusions 716 extending from a channel 746, which is shown with a tube-shaped geometry, adjacent to the top surface of the central plate 712 and into the electronic enclosure, which are shown with a fin-shaped geometry, and one or more protrusions 726 extending from the bottom surface of the central plate 712 and into the recess 711, which is shown as a single protruding plate.

The channel 746 may be configured connect to the sealed cavity formed between the heat transfer device 706 and the cold plate 704 after the heat transfer device 706 has been inserted into the recess 711. The central plate 712 of the heat transfer device 706 may directly interface with a first fluid contained within the electronic enclosure and exterior to the cold plate 704 and a second fluid contained within the cold plate 704. The channel 746 may enable an improvement in heat transfer efficiency by allowing the fluid contained within the cold plate 704 to more directly thermally interface with the central portions of the top surface protrusions 716, reducing the material the heat must conduct through. Additionally, the single bottom surface protrusion 726 may aid in diverting fluid towards the channel 746 passing through the fin-shaped protrusions 716 in embodiments involving flowing fluid in the cold plate 704, potentially further enhancing the overall heat transfer efficiency.

Figure 8:
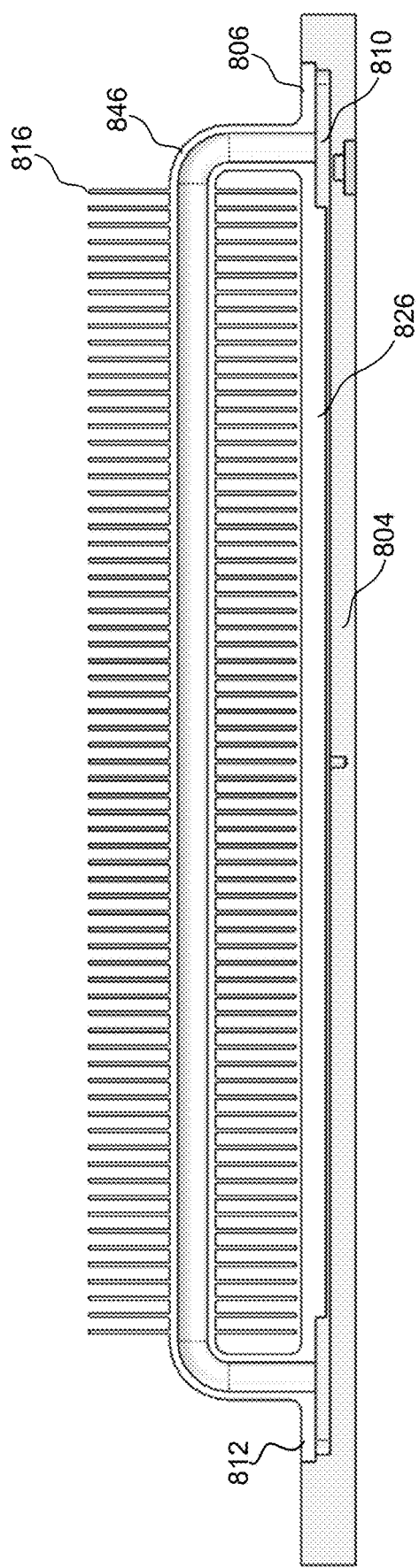
FIG. 8 illustrates an example of a cross-sectional view of a heat transfer device with fins adjacent to the top surface through which a channel passes that has been coupled to a cold plate.

FIG. 8 illustrates a cross-sectional view of an exemplary embodiment of a heat transfer device 806 with fin-shaped protrusions adjacent to the top surface through which a channel 846 passes, such as the heat transfer device of FIG. 7, that has been coupled to a cold plate 804. The heat transfer device 806 may be inserted into a recess of a cold plate 804, such as the cold plate of FIG. 7, and sealed in place using, for example, adhesive bonding, brazing, welding, friction stir welding, an O-ring or other elastomer seal, or a variety of other sealing methods known in the art. After coupling together, the top surface of the central plate 812 of the heat transfer device 806 may be flush with the top surface of the cold plate 804; however, in other embodiments, this top surface of the heat transfer device 806 may protrude from or recess into the top surface of the cold plate 804.

The coupling of the heat transfer device 806 and the cold plate 804 may form a cavity, or first channel 810, between the bottom surface of the heat transfer device 806 and a surface of the cold plate 804. The cold plate 804 may provide the first channel 810 access to a fluid within the cold plate 804, which may flow through the first channel 810. The heat transfer device 806 may also have a second tube-shaped channel 846 adjacent to the top surface of the central plate 812 that may be configured to connect to the first channel 810 and may have one or more fin-shaped protrusions 816 extending outwardly from it and into the electronic enclosure. Fluid from the cold plate 804 and first channel 810 may also flow through the second channel 846. A single protruding plate 826 may extend from the bottom surface of the central plate 812 of the heat transfer device 806 and into the fluid contained within the first channel 810. The second channel 846 may aid in improving heat transfer efficiency of the heat transfer device 806 by enabling the fluid contained within the cold plate 804 to more directly thermally interface with the central portions of the fin shaped protrusions 816 extending from the second channel 846. The single protruding plate 826 may potentially enhance this increase in heat transfer efficiency by enabling for the diversion of all or a portion of the flow of fluid from the cold plate 804 from the first channel 810 to the second channel 846.

In other embodiments, the fin-shaped protrusions 816 may extend to contact the central plate 812 of the heat transfer device 806 so that they effectively extend from the top surface of the central plate 812 into the electronic enclosure with the second channel 846 passing through.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A heat transfer system for electronic enclosures, the system comprising:
    an electronic enclosure housing electronic components and including a volume for a first fluid;
    a cold plate within the electronic enclosure, the cold plate is configured to contain within itself a second fluid, and the cold plate includes a recess providing access to the second fluid; and
    a heat transfer device configured to transfer heat from the first fluid to the second fluid, wherein the heat transfer device is a single integrated piece and is situated within the recess wherein a first surface of the heat transfer device is configured to directly interface with the first fluid and a second surface of the heat transfer device is configured to directly interface with the second fluid.

2. The heat transfer system of claim 1, wherein the heat transfer device is configured to have one or more protrusions extending from at least one of the first surface or the second surface.

3. The heat transfer system of claim 2, wherein the one or more protrusions are at least one of fin-shaped, stacked fin-shaped, or cylindrical.

4. The heat transfer system of claim 1, wherein the heat transfer device further comprises:
    a channel adjacent to the first surface, the channel configured to contain the second fluid; and
    one or more protrusions extending from the channel.

5. The heat transfer system of claim 4, wherein the channel is tube-shaped.

6. The heat transfer system of claim 4, wherein the second fluid flows through the cold plate and flows through the channel.

7. The heat transfer system of claim 1, wherein the first fluid circulates within the electronic enclosure and flows over the first surface.

8. The heat transfer system of claim 1, wherein the second fluid flows through the cold plate and flows over the second surface.

9. The heat transfer system of claim 1, wherein the first fluid comprises air.

10. The heat transfer system of claim 1, wherein the second fluid includes at least one of water, water glycol, or antifreeze.

11. The heat transfer system of claim 1, wherein the single integrated piece includes at least one of aluminum or a copper alloy.

12. A method for transferring heat within an electronic enclosure, the method comprising:
    providing an electronic enclosure housing electronic components and including a volume for a first fluid;
    providing a cold plate within the electronic enclosure configured to contain within itself a second fluid; and
    transferring heat from the first fluid to the second fluid using a heat transfer device, wherein the heat transfer device is a single integrated piece situated within a recess in the cold plate and comprises:
    a first surface configured to directly interface with the first fluid; and
    a second surface configured to directly interface with the second fluid.

13. The method of claim 12, wherein the heat transfer device further comprises one or more protrusions extending from at least one of the first surface or the second surface.

14. The method of claim 13, wherein the one or more protrusions are at least one of fin-shaped, stacked fin-shaped, or cylindrical.

15. The method of claim 12, wherein the heat transfer device further comprises:
    a channel adjacent to the first surface, the channel configured to contain the second fluid; and
    one or more protrusions extending from the channel.

16. The method of claim 15, wherein the channel is tube-shaped.

17. The method of claim 15, further comprising:
    flowing the second fluid through the cold plate and through the channel.

18. The method of claim 12, further comprising:
    circulating the first fluid within the electronic enclosure and over the first surface.

19. The method of claim 12, further comprising:
    flowing the second fluid through the cold plate and over the second surface.

20. The method of claim 12, wherein the first fluid comprises air.

21. The method of claim 12, wherein the second fluid includes at least one of water, water glycol, or antifreeze.

22. The method of claim 12, wherein the single integrated piece includes at least one of aluminum or a copper alloy.

* * * * *